United States Patent [19]

Yano

[11] Patent Number: 4,817,105
[45] Date of Patent: Mar. 28, 1989

[54] INTEGRATED LASER DEVICE WITH REFRACTIVE INDEX MODULATOR

[75] Inventor: Mitsuhiro Yano, Ebina, Japan

[73] Assignee: Fujitsu Limited, Kanagawa, Japan

[21] Appl. No.: 203,199

[22] Filed: Jun. 7, 1988

[30] Foreign Application Priority Data

Jun. 17, 1987 [JP] Japan .................................. 62-149141

[51] Int. Cl.$^4$ ............................................... H01S 3/19
[52] U.S. Cl. ........................................ 372/50; 372/20; 372/26; 372/28; 372/96
[58] Field of Search ........................ 372/20, 45, 46, 44, 372/50, 96, 26, 38, 28

[56] References Cited

U.S. PATENT DOCUMENTS 4,349,906  9/1982  Seifres et al. ........................... 372/50
4,475,200 10/1984  Lee .......................................... 372/50
4,534,033  8/1985  Nishizawa et al. ..................... 372/50

Primary Examiner—James W. Davie
Attorney, Agent, or Firm—Armstrong, Nikaido, Marmelstein & Kubovcik

[57] ABSTRACT

The present invention provides a laser device comprising a substrate; an active layer; a multi-quantum-well layer disposed on one side of the active layer and optically coupled therewith; a diffraction grating layer disposed on a side of the active layer and optically coupled therewith; and a device for applying a reverse voltage to the multi-quantum-well layer. The laser device can generate a light output, with its wavelength being controlled electrically for a 350 Å range at a 1.55 μm wavelength.

7 Claims, 6 Drawing Sheets

INTEGRATED LASER DEVICE WITH REFRACTIVE INDEX MODULATOR

BACKGROUND OF THE INVENTION

1. Field of the Invention

This invention relates to a laser device monolithically integrated with an MQW (Multi-Quantum-Well) modulator. More specifically, this invention concerns the specific structure of the laser device, wherein the oscillating frequency or phase thereof can be controlled by a bias voltage applied to the MQW layer.

2. Description of the Prior Art

In recent years, many light communication systems have been installed using a semiconductor laser as a source of coherent light modulated in a digital or pulse signal. An injection current to the laser is switched from one state to another state by outside circuitry. At present, pulse modulation is the most popular technology in light communication systems. However, modulations, such as FM, PM, FSK and PSK, now widely used in other types of electrical communication systems, are desirable. These modulations, however, involve difficult problems when applied to light communication systems. In order to transmit a lot of information or to increase a transmission distance without amplification, it is desired to utilize the modulation method other than pulse modulation. To achieve this object, a laser device or an apparatus must be developed such that the oscillating frequency or phase (these words depend on the modulation method, therefore, hereinafter "light wavelength" is used instead of frequency or phase to simplify the explanation) can be controlled by an electrical modulating signal from outside circuitry.

The light wavelength of a semiconductor laser is determined primarily by factors such as, band-gap of a semiconductor medium constituting the active layer of the laser, a longitudinal length of the active layer defining a resonance of oscillation, for a DFB (*Distributed Feed Back*) laser, a pitch of diffraction grating, an effective refractive index of a light resonator in the laser, an operating temperature thereof, etc. However, the length and the material used in a laser can not be changed once it is fabricated and put into operation.

In designing a laser device, the semiconductor material of an active layer is first considered. A semiconductor has its own band-gap characteristic, and the band-gap principally determines the oscillating light wavelength. However, the light output versus wavelength relation of a laser shows a curve having a peak value at the center wavelength and gradually drooping on both sides thereof. The actual oscillation wavelength is further controlled by dimensional factors regulating the light resonator, a plasma state of the semiconductor material in an active layer, an injection current, a refractive index, etc. Moreover, the refractive index also changes depending upon the plasma state of the semiconductor. The structure of the laser is designed to take all these factors into consideration.

As described above, the refractive index can be changed by controlling the injection current to the active layer of the laser. However, it is difficult to utilize this phenomenon directly to control the oscillation wavelength by modulating the injection current, because the control of the current flowing across the active layer in a forward direction causes some problems such as a leakage current or a temperature rise of the laser device during operation.

In one solution of the prior art, the laser is separated into two parts, arranged on the same substrate, by a crossing trench, which is vertical to a light propagating direction. The first part is utilized for laser oscillation, and the second part is utilized for changing the wavelength by controlling the injection current thereto. This results in changing the plasma state of the second part which changes the composite value of the overall refractive index.

Another method of controlling the wavelength is to utilize a reflecting mirror or diffraction grating disposed outside of the laser. This results in changing the wavelength of the composite resonator. However, it is difficult to tune the wavelength electrically.

These methods of the prior art for controlling the wavelength have problems such as a variable range of 50 Å is achievable at most for 1.3 to 1.6 $\mu$m wavelength range, and the light output is unstable.

SUMMARY OF THE INVENTION

A general object of the invention, therefore, is to provide a laser device having a broad tunable range in an oscillating light wavelength.

A more specific object of the invention is to provide a laser device comprising a device for controlling the light wavelength. The device comprises a monolithically integrated MQW layer with a light oscillating portion on the same substrate and a modulator supplying a bias voltage to the MQW layer.

Another object of the invention is to provide a laser device, wherein the control device is able to control the oscillation wavelength electrically and the control device will consume almost no electrical power. Thus, no additional heat dissipation occurs within the device.

Still another object of the invention is to provide a laser device, wherein the laser device can be fabricated using substantially the same process technology as used for conventional laser devices.

To achieve the above and other objects, the present invention provides a laser device comprising a substrate; an active layer; a plurality of quantum well layers disposed on one side of the active layer and optically coupled with the active layer; a diffraction grating layer disposed on another side of the active layer and optically coupled with the active layer; and a device for controlling an electric field within the above quantum well layers.

DETAILED DESCRIPTION OF THE PREFERRED EMBODIMENTS

Figure 1:
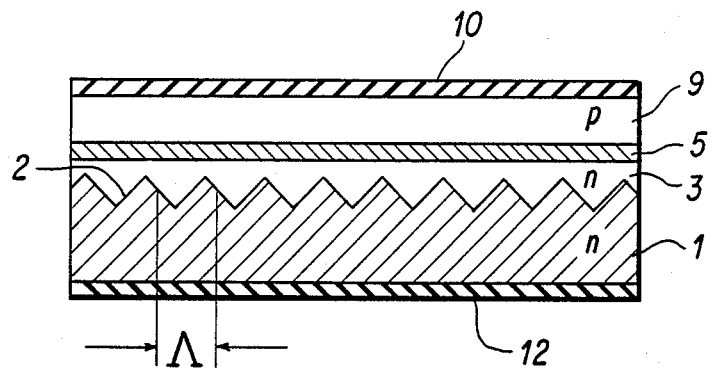
FIG. 1 shows a schematic cross section of a conventional DFB laser of the prior art.

Before entering into the detailed description of the preferred embodiment, the structure of a conventional DFB laser and influential factors for the oscillation frequency are explained using FIG. 1.

FIG. 1 is a schematic cross-sectional view of the DFB laser used for 1.3 to 1.6 $\mu$m wavelength. An n-type InP substrate 1 is utilized, and an n-type InP clad layer 3 is laminated thereon. Between clad layer 3 and substrate 1, diffraction grating 2 is formed. An InGaAsP active layer 5 and a p-type InP clad layer 9 are formed thereon. Electrodes 10 and 12 are formed on top and bottom surfaces respectively for connecting to positive and negative terminals of a power supply (not shown).

The semiconductor material InGaAsP, used for active layer 5, is a quaternary alloy semiconductor material. The composition ratio of each constituent element is determined by an energy band-gap of the quaternary semiconductor or the light wavelength which this material can generate when excited. A light resonator, which forms the light transmission guide, is composed of an active layer 5, an n-type clad layer 3, a diffraction grating 2 and a thin layer of a p-type clad layer 9 contacting the active layer 5. The pitch $\Lambda$ of the diffraction grating and the effective refractive index of the above light transmission guide determines the resonance frequency of the light resonator. When the energy band-gap curve of the active layer has the corresponding wavelength of the above light resonator, light oscillation will build up.

Figure 2:
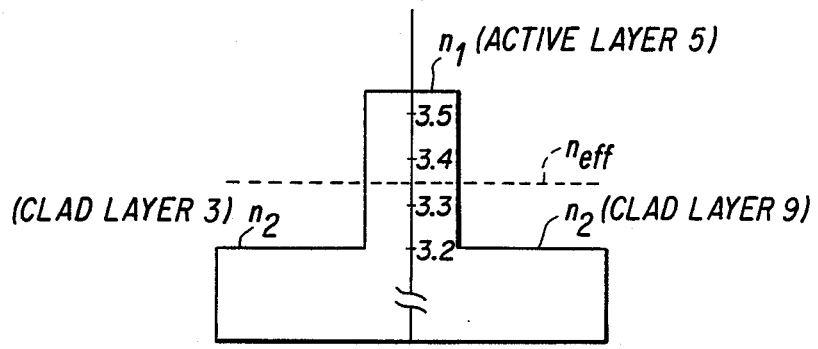
FIG. 2 illustrates a relationship between the effective refractive index of the light transmission guide and each refractive index constituting it in FIG. 1.

In order to confine the light beam within a thin layer of the light transmission guide, the refractive index $n_1$ of the active layer 5 should be larger than the refractive index $n_2$ of both contacting clad layers 3 and 9. In this case, $n_1$ of InGaAsP has a value of about 3.55 and $n_2$ of InP has a value of 3.20. The effective refractive index $n_{eff}$ has a value between 3.3 to 3.4 depending upon the thickness of these layers. This is illustrated in FIG. 2. The thickness of the active layer is selected to be within a range of 0.1 to 0.2 $\mu$m. The contacting clad layers have a thickness in the range of less than about 0.5 $\mu$m. This gives an effect on the effective refractive index $n_{eff}$ or the output light wavelength.

The refractive index of each layer forming the light transmission guide changes slightly depending on factors such as the temperature thereof, the injection current, a bulk semiconductor Stark effect due to the electric field applied thereto, etc. These factors usually cause an unwanted drift or a change in output light wavelength.

For a long time, the Stark effect has been known as a phenomenon that, when the material is subjected to an electric field, the frequency of an electro-magnetic wave or an optical absorption, shifts from the frequency without the electric field. Recently, the Stark effect in a quantum well structure has been studied and reported. The quantum well influences the shift of the optical absorption and accompanying change of the refractive index. The following literature reveals some of the characteristics of the quantum well structure under the influence of an electric field.

"Band-Edge Electroabsorption in Quantum Well Structure: The Quantam-Confined Stark Effect" by D. A. B. Miller et al; Physical Review Letters, Vol. 53, No. 22, Nov. 1984.

"Multiple Quantum Well Waveguide Modulators" by T. H. Wood, et al; International Conference on Optical Fibre Communications, February 1986.

"High-Speed Electroabsorption Modulator With Strip-Loaded InGaAsP Planar Waveguide" by Y. Noda, et al; International Conference on Optical Fibre Communications; February 1986.

"Highly Efficient Waveguide Phase Modulator For Integrated Optoelectronics" by A. Alping, et al; Appl. Phys. Lett. 48(19), May 12, 1986.

Figure 3:
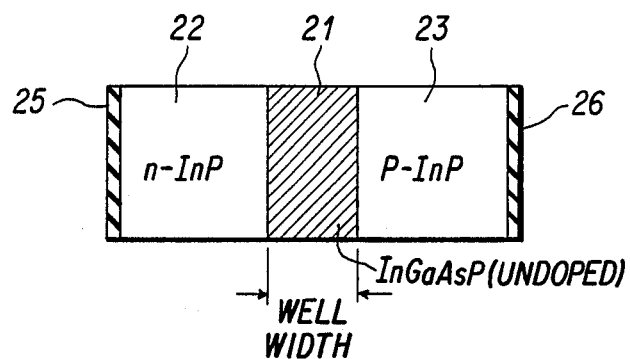
FIG. 3 shows a schematic cross section forming a single quantum well.
Figure 4:
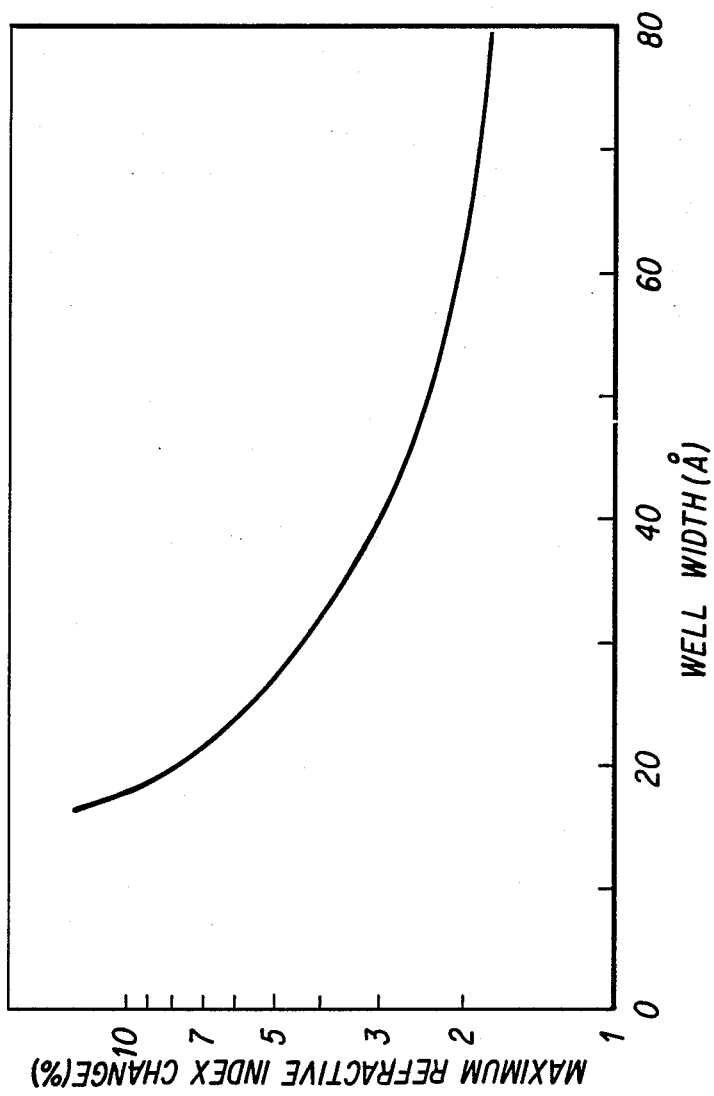
FIG. 4 illustrates a curve showing the relationship between the width of the single quantum well and the maximum percent change of the refractive index thereof.

The present invention positively utilizes the Stark effect in a quantum well structure for changing the oscillation wavelength of a laser. Before going into the MQW structure, a single quantum well, as shown in FIG. 3, is first considered. An undoped InGaAsP well layer 21, having an energy band gap equivalent to 1.5 $\mu$m, is used and sandwiched with two barrier layers of an n-type InP 22 and a p-type InP 23. The width of the well layer 21 is selected to be sufficiently thin such as less than 100 Å. Contact electrodes 25, 26 are formed and a bias voltage Vb is applied therebetween. The well layer is subjected to light having a 1.55 $\mu$m wavelength. In FIG. 3, electrodes 25 and 26 are connected to positive and negative terminals respectively of a power source (not shown). The reverse voltage Vb is selected such that it gives a maximum change in the refractive index of the InGaAsP well layer 21, but it will not cause the break down of the well layer. A curve illustrating the well width versus maximum percent of refractive index change is calculated as shown in FIG. 4. The maximum percent of the refractive index change increases rapidly (in this case, the refractive index decreases) with a decrease of the well width and exceeds 10% at the lower end portion of the width.

Figure 5:
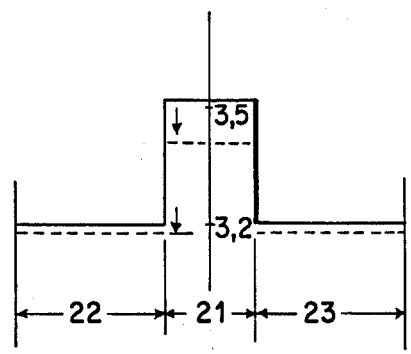
FIG. 5 shows schematically the refractive index change when the well layer and barrier layer are subjected to a reverse voltage.

The refractive index curve is shown schematically in FIG. 5, wherein the solid line shows data without having a bias voltage Vb applied and the dashed line shows data with an electric field due to an applied bias voltage. In FIG. 5, the refractive indices of both barrier layers 22, 23 show a slight decrease, which is caused by a Franz-Keldysh effect, the details of which are not, however, referred to here. On the other hand, the refractive index of the well layer 21 shows a larger decrease according to the curve of FIG. 4.

When a plurality of quantum well layers is laminated forming a MQW layer, its effective refractive index $n_{mqw}$ can be calculated by a method such that the total width of each of the well layers and the barrier layers is multiplied with the respective refractive index and then averaged by dividing the total width of the MQW layer. Thus the controllable range of the effective refractive index $n_{mqw}$ of the MQW layer can be obtained for the given bias voltage Vb across the MQW layer.

The MQW layer should be formed within a neighboring region such that the MQW layer influences the resonance wavelength of the light resonator by disposing the MQW layer within a distance of about 0.5 μm from the active layer. In order to obtain an effective variable range of the light wavelength of the laser device, the effective refractive index $n_{res}$ of the overall synthetic light resonator is to be calculated. All refractive indices of each layer constituting the light resonator are taken into consideration.

Figure 6A:
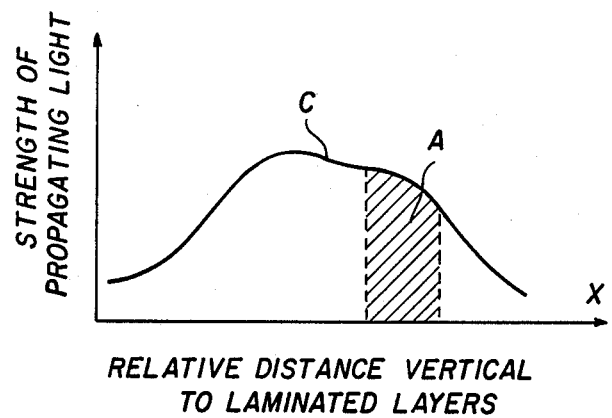
FIG. 6(*a*) shows the light intensity distribution in the light transmission guide in order to explain what position the MQW layer is to be formed according to the present invention.
FIG. 6(b) shows the bottom level of conduction band Ec corresponding to the position of FIG. 6(a)
Figure 6B:
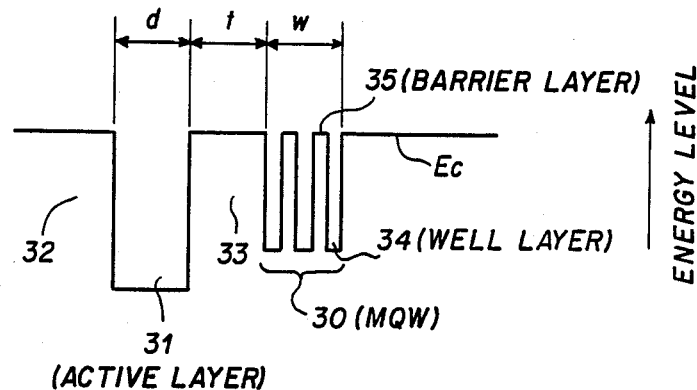

This situation is schematically illustrated in FIG. 6. In FIG. 6(a), an abscissa shows the arbitrary relative distance x vertical to the laminated layers of the optical resonator. An ordinate shows schematically an electric field strength of the propagating light within the light resonator. In other words, the curve shows the equivalent data of light strength, and further also shows the relative data of the refractive index at each position when the laser is put into operation. FIG. 6(b) shows the bottom of the conduction band Ec in an energy level diagram for each layer. The active layer 31, such as of InGaAsP, is sandwiched with two clad layers 32, 33 of InP. The MQW layer 30 consists of well layers 34 of InGaAsP and barrier layers 35 of InP. The barrier layers 35, having a higher energy level of Ec at a non-bias state, and the well layers 34, having a lower level, are alternately laminated and form the MQW layer 30. The positional relationship between FIGS. 6(a) and 6(b) shows that the MQW layer 30 is formed under the umbrella of the curve C of FIG. 6(a). This condition is an important point in designing the variable wavelength laser using the MQW layer. The change of the effective refractive index $n_{mqw}$ of the MQW layer by a bias voltage brings about a change of the hatched area A under the curve C of FIG. 6(a), resulting in changes in the effective refractive index $n_{res}$ and in the light frequency.

Therefore, the width w of the MQW layer is selected such that the area A occupies a predetermined portion of the area under the umbrella of curve C. If the width w is much smaller than the thickness of the active layer d (w<<d), the area A takes a small portion of the total area under the curve C and the effective variable range of the wavelength is not expected to be very much. On the other hand, if w is much larger than d (w>>d), the change of the effective refractive index $n_{mqw}$ contributes to a wider change of the total effective refractive index of $n_{res}$ or the light wavelength. However, it incurs an increase of the threshold current of the laser. Therefore it is preferable to select a width w close the thickness d of the active layer.

Figure 7:
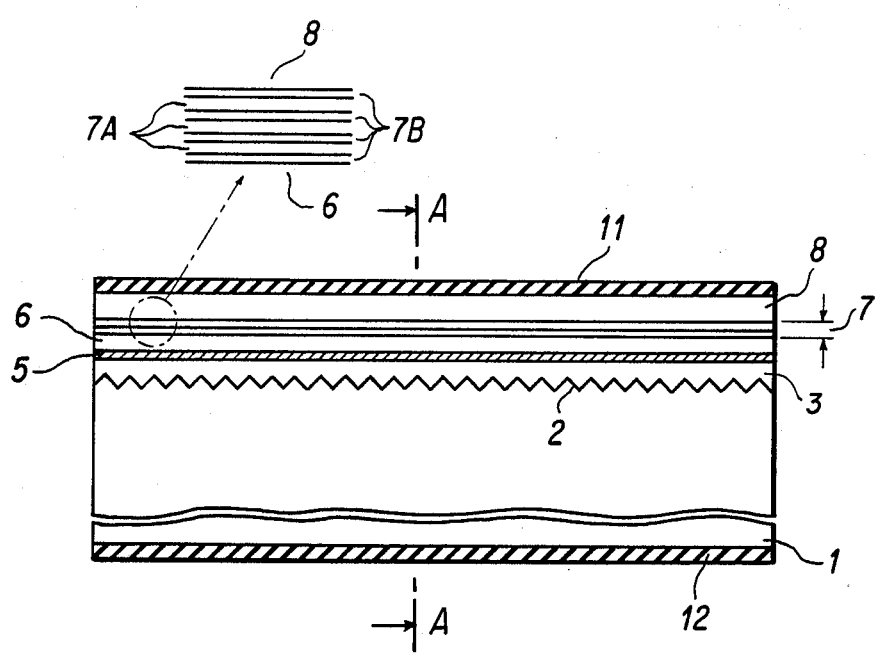
FIG. 7 shows a cross section of one of the embodiments according to the present invention.

As an actual structure of the wavelength controllable laser device according to the present invention, one example of the preferred embodiment is shown in FIG. 7. FIG. 7 illustrates a cross section along a direction of a light beam. A cross sectional view taken along a line A—A of FIG. 7 is shown in FIG. 8 with the attached power sources thereto.

Figure 8:
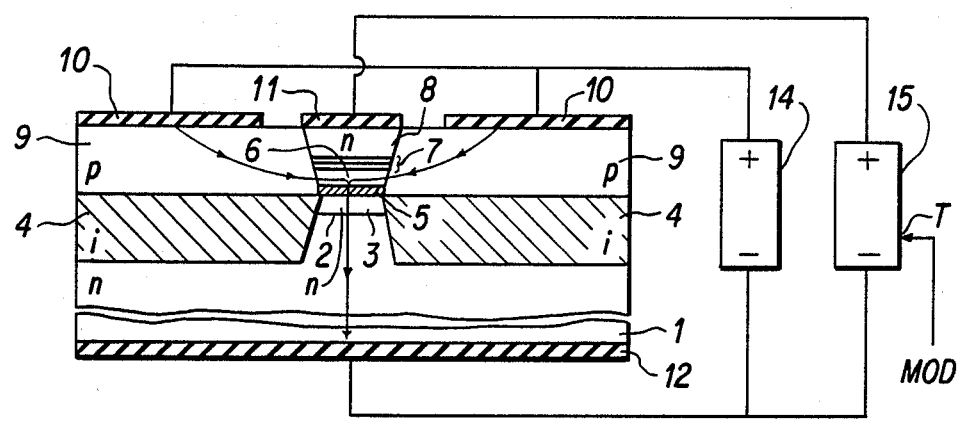
FIG. 8 shows a cross section taken along a line A—A of FIG. 7.

To fabricate the buried heterostructure such as shown in FIGS. 7 and 8, several methods may be applicable. As for the epitaxial growth, the methods such as liquid phase epitaxial growth and MBE (Molecular Beam Epitaxy) are generally used. However, because the embodiment of the invention utilizes the MQW structure, the MQW structure can be fabricated only by a MBE method.

For manufacturing the laser device of a wavelength of 1.55 μm, an n-type InP substrate 1 is used. Then, a diffractive grating 2 is formed on the surface of the n-type InP substrate 1, using a known technology such as a two light beam interference exposure method, whereby the pitch Λ of the grating is selected to satisfy the condition of $\Lambda = m \times (\lambda/2n_{res})$, where λ is an output light wavelength, and m is an integer, and $n_{res}$ is the equivalent refractive index of the light resonator.

Then, an n-type InP clad layer 3, having an impurity density of $5 \times 10^{17}/cm^3$ and a thickness of 0.12 to 0.22 μm, an undoped InGaAsP active layer 5, having a thickness of 0.1 μm and a p-type InP clad layer 6, having an impurity density of $1 \sim 2 \times 10^{18}/cm^3$ are formed one by one. Then, a MQW layer 7 is grown thereon by a MBE method. The MQW layer is composed of 12 InGaAsP well layers 7B of a 20 Å thickness and 11 InP barrier layers 7A of a 80 Å thickness. An n-type InP layer 8 having an impurity density of $5 \times 10^{17}/cm^3$ and a thickness of $1 \sim 1.5$ μm is grown thereon.

To fabricate the strip-shaped laminated layers buried with the high resistive layer 4 and a p-type InP layer 9 on both sides thereof, the entire surface of the above substrate, with the laminated layers, is subjected to a deposition process of silicon dioxide. Then, the silicon dioxide layer is partly removed, except in the strip-shaped area, by a photolithography technique. Laminated layers for both sides of the strip-shaped area is then etched away, using a wet etching process until a specified depth is obtained. Then, a high resistive layer 4 of intrinsic InP and subsequently a p-type InP layer 9, having an impurity density of $1 \times 10^{18}/10^3$ and a thickness of $1 \sim 1.5$ μm, are grown.

Two electrodes 10, 11 and one electrode 12 are formed on the upper and bottom surfaces using TiPtAu and AuGeNi material respectively. The electrode 10 is connected to a power source 14 for laser oscillation and the electrode is connected to a power source 15 for supplying a reverse voltage. The electrode 12 is used for the negative common connection.

When the completed laser device, as shown in FIGS. 7 and 8, is put into operation, the driving current, for laser oscillation by a forward bias voltage between two clad layers 3 and 6, flows along the path shown by arrows such as electrode 10=> p-type InP layer 9=> p-type InP clad layer 6=> InGaAsP active layer 5=> n-type InP clad layer 3=> n-type InP substrate 1=> electrode 12 High resistive layer 4 prevents the current from flowing through this layer 4 and forces the current to flow through the InGaAsP active layer 5. Therefore, the surface level of the high resistive layer 4 is required to be not lower than that of the upper surface of the n-type InP clad layer 3 in order to prevent direct current flow from the p-type InP layer 9 to the n-type InP clad layer 3.

On the other hand, the buried strip-shaped layers of the n-type InP layer 8, the MQW layer 7, and the p-type InP clad layer 6 are subjected to the reverse bias voltage Vb supplied by the power source 15. Namely, the n-type contact layer 8 is applied with a positive voltage with regard to the p-type clad layer 6. Therefore, no current flows therethrough. When the voltage Vb is varied, the change of the refractive index $n_{mqw}$ of the MQW layer 7 makes the effective refractive index $n_{res}$ of the overall optical resonator also change. This results in the ability to modulate the output light wavelength from the laser device.

Figure 9:
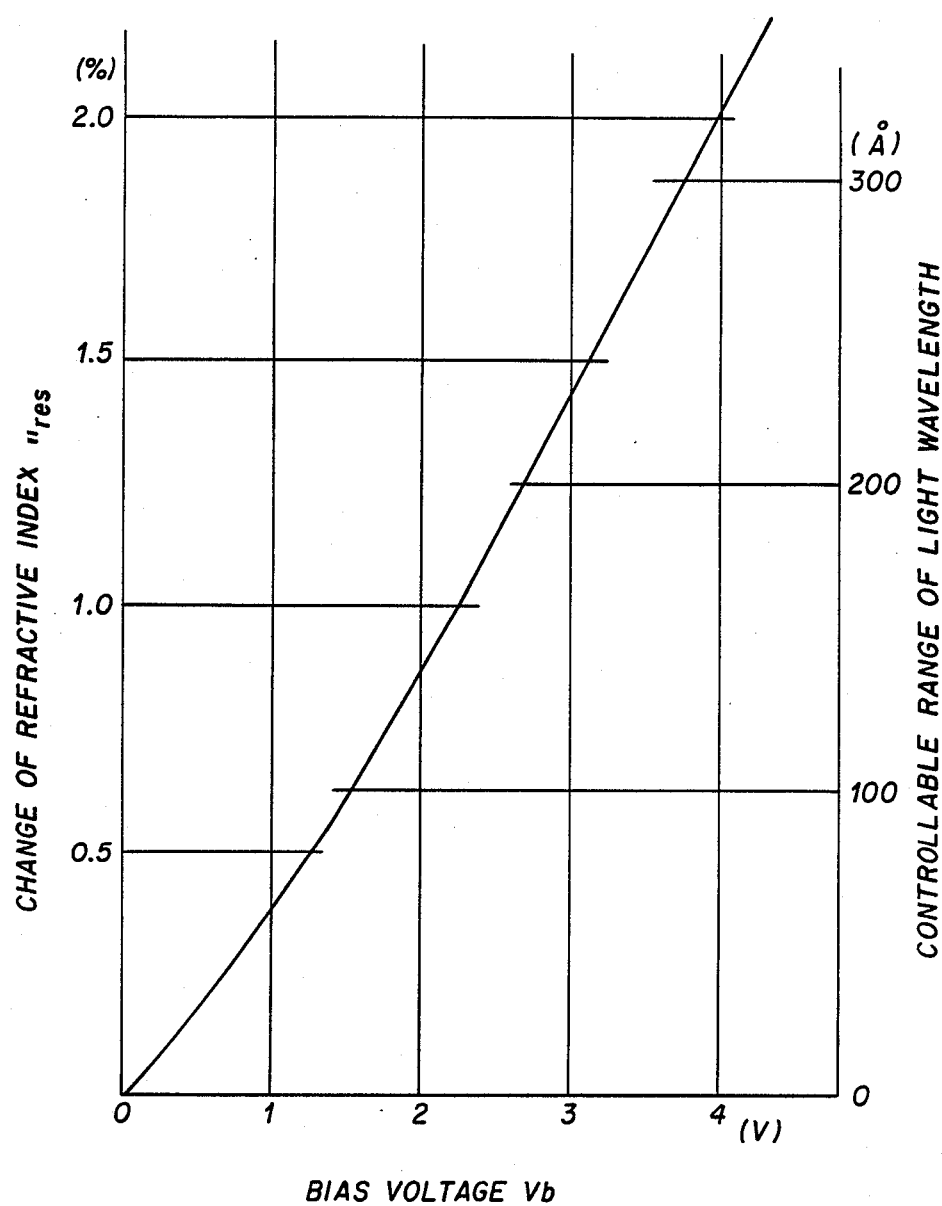
FIG. 9 illustrates a curve showing test results based on the relationship between the applied bias voltage and the percent refractive index change and the relationship between the applied bias voltage and a controllable wavelength range.

One of the test results for the 1.55 μm laser device is shown in FIG. 9. The abscissa shows the bias voltage Vb. In actual operation, the oscillating portion of the device is subjected to a forward voltage supplied by the power source 14. Therefore, the p-type clad layer 6 is driven to a positive voltage with regard to the common negative terminal voltage of the power source 14. The bias voltage Vb in FIG. 9 means the voltage, of which a substantial portion thereof is applied across the MQW layer 7. The voltage is almost equal to the voltage difference between the voltages applied to electrode 11 and electrode 10. The ordinate shows a change of the refractive index $n_{res}$ in percent (this case shows a negative change) of the light resonator on the left side and a decrease of the light wavelength from a state without bias voltage. The maximum change in the light wavelength reaches approximately 350 Å. This value is much larger than those obtained in the prior art, which were at most 50 Å. When the modulating signal is superposed on the bias voltage Vb from terminal T attached to the power source 15, the output light wavelength can be modulated according to the modulation signal.

Although only one embodiment of 1.55 μm laser device has been disclosed and described, however, it is apparent that the present invention can be extended to other structures and wavelength without departing from the spirit or essential characteristics thereof.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What is claimed is:

1. A laser device comprising:
   a semiconductor substrate of a first conductivity type;
   a first clad layer of a first conductive type formed over said semiconductor substrate, said first clad layer forming a diffraction grating;
   an active layer formed on said first clad layer;
   a second clad layer of a second conductivity type formed on a surface of said active layer;
   a multi-quantum-well layer formed on said second clad layer, said multi-quantum-well layer being optically coupled with said active layer;
   a contact layer of the first conductivity type formed on a surface of said multi-quantum-well layer;
   a forward supply means for supplying a forward voltage between said first clad layer and said second clad layer; and
   a reverse supply means for supplying a reverse voltage between said second clad layer and said contact layer.

2. A laser device according to claim 1, wherein the first clad layer, the active layer, the second clad layer, the multi-quantum-well layer, and the contact layer are formed in a strip-shaped pattern, and said laser device further comprises a high resistive layer on the substrate and a conductive layer of the second conductivity type formed thereon, both layers being formed on both sides of said strip-shaped patterns and burying these patterns.

3. A laser device according to claim 2, wherein said high resistive layer has a thickness which is large enough to avoid said conductive layer directly contacting said first clad layer.

4. A laser device according to claim 1, wherein said multi-quantum-well layer is formed in a vicinity where the propagating light has sufficient light intensity.

5. A laser device according to claim 1, wherein the thickness of each well layer of said multi-quantum well layer is selected to be less than 40 Å.

6. A laser device according to claim 1, wherein the total thickness of said multi-quantum-well layer is selected to be substantially the thickness of said active layer.

7. A laser device according to claims 2 or 3, wherein said laser device further comprises a first electrode on said conductive layer and a second electrode on said contact layer, each pattern of the electrodes being separated from each other, and said first electrode being connected to the forward supply means and said second electrode being connected to the reverse supply means.

* * * * *